United States Patent [19]

Van Zanten

[11] Patent Number: 4,466,011
[45] Date of Patent: Aug. 14, 1984

[54] DEVICE FOR PROTECTION AGAINST LEAKAGE CURRENTS IN INTEGRATED CIRCUITS

[75] Inventor: François Van Zanten, Paris, France

[73] Assignee: Thomson-CSF, Paris, France

[21] Appl. No.: 263,203

[22] Filed: May 13, 1981

[30] Foreign Application Priority Data

May 14, 1980 [FR] France .................... 80 10842

[51] Int. Cl.$^3$ .......................................... H01L 27/04
[52] U.S. Cl. .................................... 357/48; 307/303; 357/86
[58] Field of Search ................ 357/48, 86; 307/303

[56] References Cited

U.S. PATENT DOCUMENTS

| | | | |
|---|---|---|---|
| 3,590,345 | 6/1971 | Brewer et al. | 357/86 |
| 3,676,714 | 7/1972 | Wersink et al. | 357/86 |
| 3,878,551 | 4/1975 | Callahan, Jr. | 357/86 |
| 3,931,634 | 1/1976 | Knight | 357/86 |
| 3,940,785 | 2/1976 | Genesi | 357/48 |
| 4,027,325 | 5/1977 | Genesi | 357/48 |
| 4,044,373 | 8/1977 | Nomiya et al. | 357/48 |

FOREIGN PATENT DOCUMENTS

| | | |
|---|---|---|
| 2113906 | 6/1972 | France . |
| 2303382 | 3/1976 | France . |
| 506889 | 6/1971 | Switzerland . |

OTHER PUBLICATIONS

Electronics Jul. 24 1975, pp. 31-32.
Frederiksen et al., IEEE J. of Solid State Circuits, vol. SC 9 No. 6, Dec. 1974, pp. 400-401.

Primary Examiner—William D. Larkins
Attorney, Agent, or Firm—Cushman, Darby & Cushman

[57] ABSTRACT

In a bipolar integrated circuit, wherein the elementary components are formed in islands of an N-type epitaxial layer surrounded by P-type isolation walls, a protection against leakage currents is obtained by surrounding an island susceptible to receive negative voltage surges with an annular island. The isolation wall between the considered island and the annular island is connected to the potential of the most negative supply source and the isolation wall external to the annular island is connected thereto.

9 Claims, 7 Drawing Figures

"PRIOR ART"

"PRIOR ART"

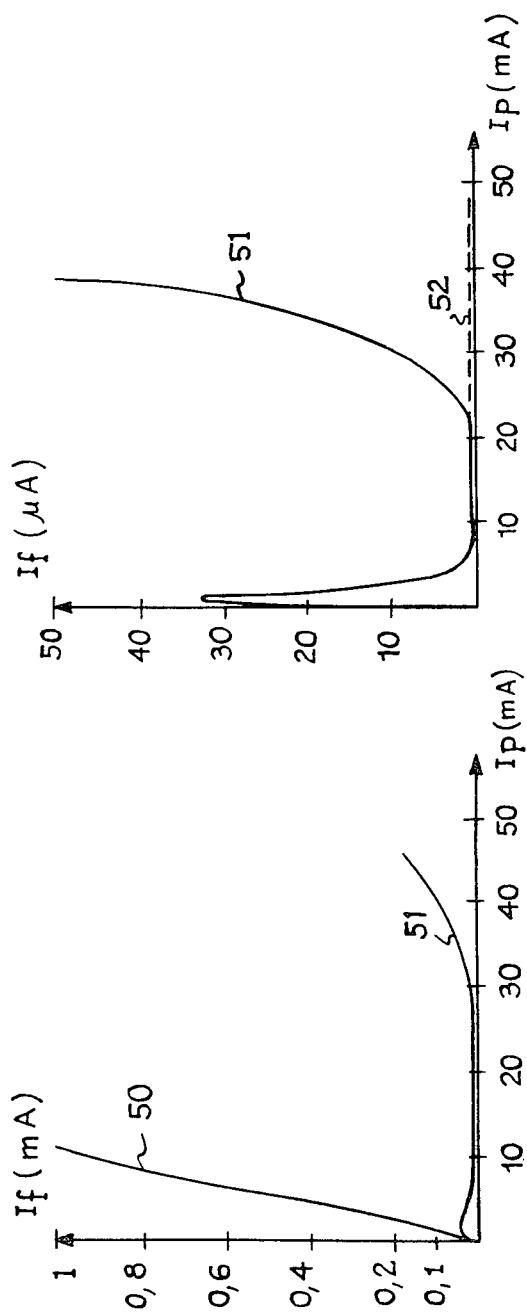

DEVICE FOR PROTECTION AGAINST LEAKAGE CURRENTS IN INTEGRATED CIRCUITS

BRIEF DESCRIPTION OF THE INVENTION

The present invention concerns a device for protection against leakage currents in monolithic integrated circuits where these leakage currents are caused by reverse parasitic surges.

BACKGROUND OF THE INVENTION

In the following description reference is made to bipolar integrated circuits on a substrate on the P-type and an epitaxied layer of the N-type. The present invention applies also to the case where the type of conductivity of the different layers is reversed.

FIG. 1 shows partially and very schematically a portion of a classical bipolar integrated circuit in a perspective sectional view. This circuit is applied to a substrate 1 of the P-type on which an epitaxied layer of the N-type is sub-divided into islands by the insulation walls 2 of the P+-type. Inside of each island a special component is formed, for example a transistor NPN or PNP which is insulated from adjacent components by insulation walls 2. To make sure that the functioning of the components inside each island is independent of that of the adjacent components, it is necessary that the polarity between the islands and the substrate connected to the supply voltage is such that the junction NP between each island and the substrate is blocked. Thus, the substrate can be polarized more negatively than each of the islands. Nevertheless, in view of the environment and the outer connections of the components inside the islands, it can happen that one of the islands, for example island 3, receives parasitic voltage more negative than the polarisation voltage of the substrate. Accordingly, the junction NP between the island and the substrate is unblocked and the electrons can be injected into the substrate. These electrons are subject to diffusion in the substrate and are collected by the surrounding islands, indicated collectively by the reference 4, whereby leakage currents can appear in the components situated in the surrounding islands 4. It is to be noted that the islands closest to the parasitic island are the ones which are most susceptible to being affected.

In FIG. 1 there are also shown the buried layers 5 of the N+-type at the bottom of each of the islands 3 and 4, as this is customary in the technology of bipolar integrated circuits. Another manner of considering the leakage currents which appear in the islands 4 next to the island 3 which is submitted to negative surges, consists in saying that the leakage currents result from the circulation of current between emitter and collector of a multicollector lateral transistor whose emitter is formed by the island 3 which can be subject to a negative parasitic surge, the base of which is constituted by the substrate 1 and whose collectors are constituted by the various islands 4.

In the prior art a structure schematically shown in FIGS. 2 and 3 has been used in an attempt to solve the problem of contamination of islands adjacent to an island which may be subjected to different negative voltages. Around the island 3, subject to receiving parasitic negative voltages, an annular island 6 is provided which surrounds at least partially the island 3 and is interposed between the island 3 and the island 4 to be protected. As shown in FIG. 3, a metallic coating 7 is applied onto the annular island 6 with interposition, as usual, of a highly doped layer 8 of the same type of conductivity as that of the island 6 providing an ohmic contact. This annular metal coating 7 is connected to the positive supply terminal of the integrated circuit. Thus, when a parasitic surge, appearing in the form of a current source 9 tending to cause the current to leave the island 3, is applied, it results in injecting electrons into the substrate. This injection of electrons is indicated by the arrow 10 in strong outlines. The electrons 10 have the tendency to be collected by the island 6, then are returned by the metallic coating 7 and the corresponding connection towards the positive supply. If we do not consider the direction of conduction of electrons but the classical direction of the current flow, one can say that a current circulates from the positive supply terminal through the annular island 6, the substrate 1 and the island 3 toward the current source 9. Due to this process, a large portion of the electrons which are diffused in the substrate 1 are collected by the annular island 6. Nevertheless, a small portion of these electrons, indicated by the thin arrow 11, continues to be diffused in the substrate toward the adjacent islands 4 in which a leakage is created. In practice, applicant has observed that only 9/10 of the total leakage current is absorbed by the annular island 6 and that there remains about 1/10 of the current injected by the current source 9 which contributes to the leakage of the islands 4. On the other hand, the current taken from the positive terminal of the supply source of the integrated circuit contributes to the growth of the power dissipated therein. To remedy the latter inconvenience, it is also possible to connect the metallic coating of the annular island to the ground which reduces power dissipation in the integrated circuit but reduces also the efficiency of collection of the annular island.

BROAD STATEMENT OF THE INVENTION

An object of the present invention is to provide a new type of protection device against leakage currents in an integrated circuit which has better results than the prior art devices.

A particular object of the present invention is to provide such a protection device which does not cause power dissipation in the integrated circuit. Another object of the invention is to provide a protection device which reduces the leakage currents by a factor $10^5$ to $10^7$ and not simply of 10 as in the prior art devices.

DETAILED DESCRIPTION OF THE INVENTION

In order to attain said objects, as well as others, the present invention, while providing in a manner known per se for surrounding an island, susceptible of becoming parasitic, by an annular island, further provides — instead of connecting said annular island to the terminal of the positive supply of the integrated circuit — for connecting said annular island to its corresponding outer insulation wall. Furthermore, according to the invention, the insulation wall which separates the parasitic island from the annular island, is connected with the most negative potential of the supply voltage.

As will be explained in the following detailed description of the preferred embodiments of the present invention, when the connections described above are provided, the annular island no longer has the same function as the one in the prior art, and the protection of adjacent islands from the island subject to becoming parasitic is assured by creating an electric field which opposes the diffusion of electrons generated near the junction between the parasitic island and the substrate.

BRIEF DESCRIPTION OF THE DRAWINGS

These and other objects, characteristics and advantages of the present invention will be set forth in details in the following description of the various embodiments in accordance with the attached drawings wherein:

FIGS. 6 and 7 are curves which illustrate the results obtained by using the device according to the present invention.

DETAILED DESCRIPTION OF A PREFERRED EMBODIMENT OF THE INVENTION

Figure 1:
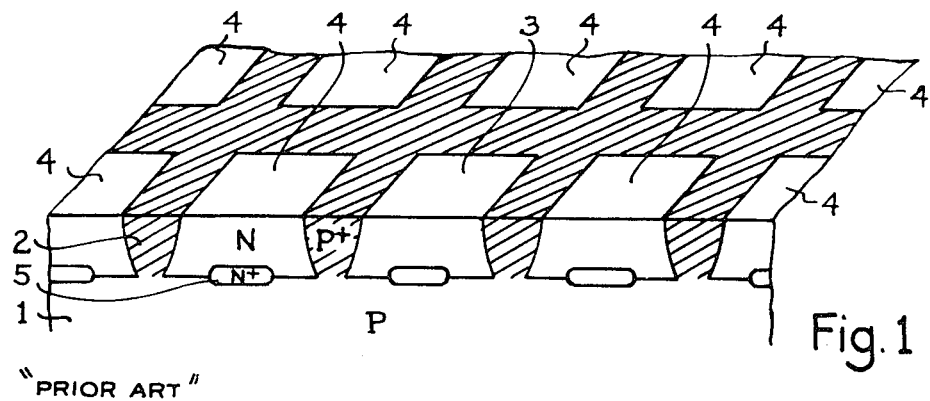
FIGS. 1 to 3 are intended to show the problem which is solved by the present invention and to indicate the partial solutions of the prior art which are described above.

It can be seen in the various figures that, according to what is customary in the semi-conductor field, the different semi-conductive layers and zones are neither shown in scale, nor from one figure to another, nor inside of one and the same figure, but are only sketched with the aim to be explanatory. However, the same reference numerals indicate the same zones, layers and components in the various figures.

Figure 3:
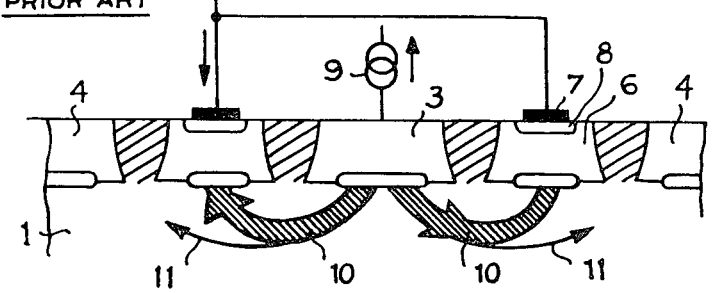
Figure 4:
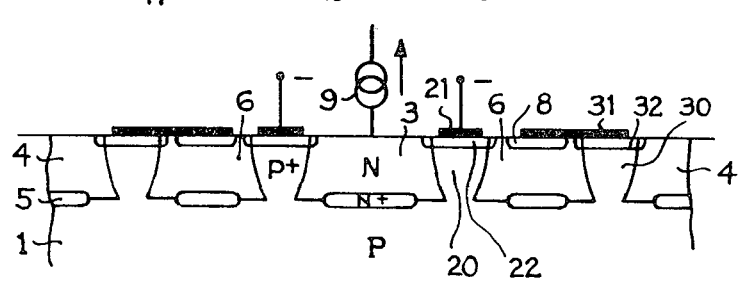
FIG. 4 is a schematic view illustrating the present invention.
Figure 5:
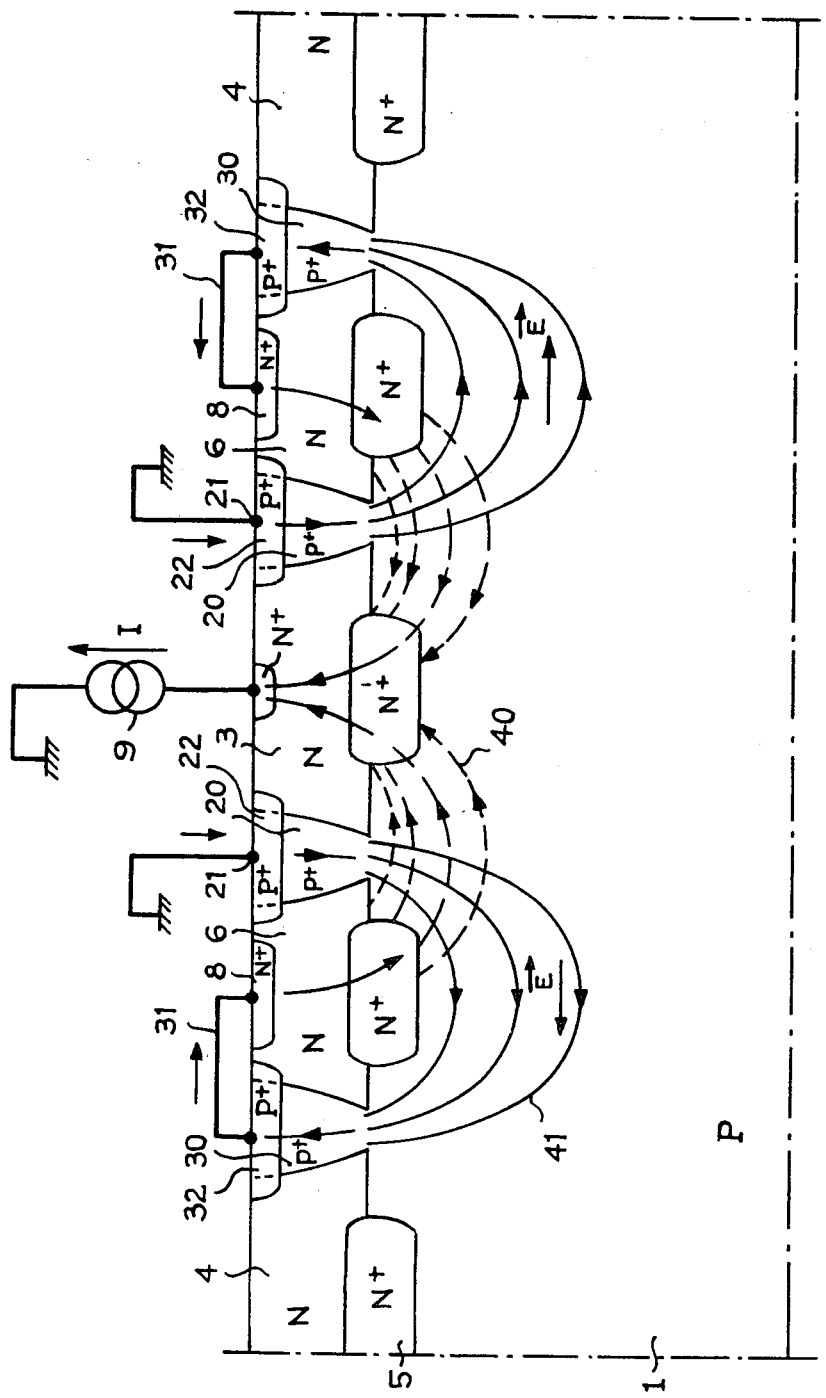
FIG. 5 is a schematic sectional view, intended to support a theoretical explanation of the functioning of the device according to the present invention.

FIG. 4 is a sectional view of a device according to the present invention. This sectional view corresponds to the plan view of FIG. 2, i.e. it shows that the island 3, subject to receive negative parasitic voltages, is surrounded by an annular island 6 for protection o the adjacent islands 4. The difference between the invention as shown schematically in FIG. 4 and the prior art devices as shown schematically in FIG. 3, resides substantially in the metallization and connections of the various layers. According to the invention, the insulation wall 20 which separates the island 3 from the annular island 6, is coated by a metallization layer 21 connected to the most negative supply terminal of the circuit. A doped zone 22 of the P+-type is provided if necessary in order to improve the electrical resistance properties of the contact between the metallization layer 21 and the surface of the insulating wall 20. On the other hand, while the reference numeral 30 is given to the outer insulating wall of the annular island 6, the visible surface of said insulating wall is connected by a metallization layer 31 to the visible surface of the annular island 6. As in the case of FIG. 3, a doped layer 8 assures the desired electric resistance properties of the contact between island 6 and the metallization layer 31. In the same way, a doped zone 32 assures, if necessary, the desired electric resistance properties of the contact between the metallization layer 31 and the surface of the insulating wall 30. FIG. 5 is based substantially on FIG. 4 but it also shows in addition the circulation of the power lines of the electric field so that this figure can support the theoretical explanation of the operation of the device according to the invention. This theoretical explanation is given only by way of example in order to assist the reader in understanding in a general way the present invention. Any error or omission in this theoretical explanation has no bearing on the validity of the invention, the results of which have been ascertained experimentally by the applicant as will be explained below. In the drawing the conduction current is shown in full lines in the substrate resulting from majority carriers (holes). The diffusion current of the minority carriers (electrons) is shown in dotted lines. It is understood that the electrons move in the reverse direction relative to the arrows in the figure which indicate the conventional current flow. In FIG. 5 the most negative potential of the power source has been indicated by the classical ground symbol. When a voltage which is more negative than the reference potential, i.e. the ground in the example shown, is applied to the island 3, the electrons are injected under the island into the substrate 1 and radially diffused as indicated by the dotted lines. Said electrons are collected by the annular island 6 and the current moves towards the ground while passing rhough the metallization layer 31, the wall 30, again the substrate 1, the wall 20 between the annular island 6 and the island 3, and the metallization layer 21. This means that two currents in reversed directions pass through the substrate 1: a current 40 directed toward the island 3 and corresponding to the diffusion of electrons, and a current 41 directed toward the outside relative to the island 3 and corresponding to the conduction between the walls 20 and 30. It is important to note that the current 41 results from the current 40 and is substantially proportional to the current 40 or parasitic current. The current 41 creates in the substrate 1 which has a given specific resistance, a radial electric field E which is oriented toward the outside of the island 3 and has an intensity approximately proportional to the parasitic current 40 from which it results. Thus, the excess electrons under the island 3 cannot cross the potential-barrier established by the electric field E and are recombined on the spot. The recombination current (not shown in FIG. 5) is delivered to the substrate by the metallization layer 21 and the wall 20. In other words, the parasitic current which generates electrons in the substrate, creates an electric field which serves to confine said electrons and produces its own remedy. A correction proportional to the magnitude of the current resulting from parasitic voltages is thus obtained. The quality of this compensation will be illustrated in connection with the diagrams of FIGS. 6 and 7.

Figure 2:
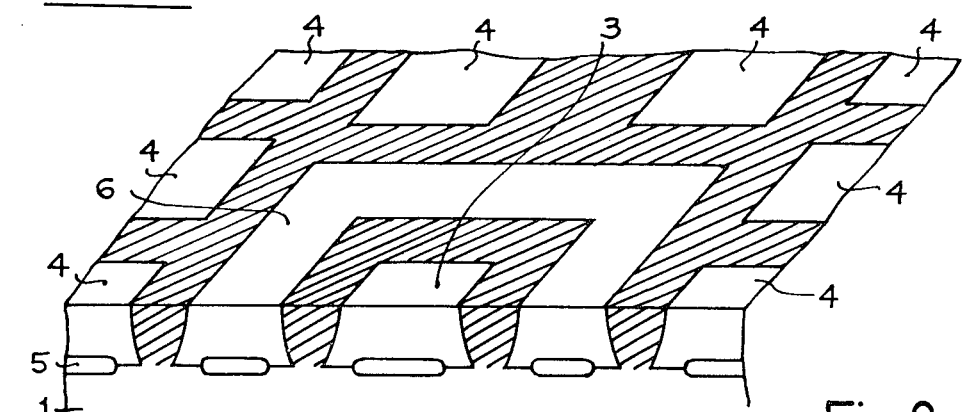

In FIGS. 6 and 7, corresponding to oscillograms drawn up by the inventor, the ordinates indicate the sum of the leakage currents $I_f$ in the islands to be protected, such as islands 4 in FIG. 2, and the abscissae indicate the parasitic current $I_p$ injected into the parasitic island such as island 3 of FIG. 2. The abscissae are in mA and correspond to a variation of the current $I_p$ of 0 to 50mA, and the ordinates are, for FIG. 6, in mA and extend from 0 to 1 mA and, for FIG. 7 in $\mu$A, and extend from 0 to 50 $\mu$A. In FIG. 6, the curve 50 corresponds to prior art devices as illustrated in FIG. 3, and the curve 51 corresponds to a device according to the present invention as shown in FIGS. 4 and 5. FIG. 6 shows how, in a prior art device, a leakage current in the mA range is attained for the transistor unit to be protected as soon as the injected current reaches a value in the order of 10 mA. This means that only 9/10 of the current injected is absorbed by the annular island. On the other hand, as illustrated by curve 51, the device according to the present invention allows to obtain leakage currents in the islands 4 to be protected, which are lower than several tens of $\mu$A in a range from 0 to 30 mA of injected current, the sum of the leakage currents being even lower than 1 μA for injected current values ranging between about 10 and 30 μA. The curve 51 is taken up again in FIG. 7 on a larger scale in the ordinates. To avoid an increase in the current (which however remains well below that in the prior art devices), for the values of the injected parasitic currents higher than 30 mA, i.e. for the strong parasitic negative voltages applied, the present invention provides for connecting the metallization layer 31 (see FIG. 4) to a metallization layer integral with the substrate 1, and, more particularly, with the outer surface of the substrate. The curve 51 is extended by the curve in dotted lines marked 52 in FIG. 7, and the device retains all its efficiency against injected currents which may be above 100 mA. It can be assumed that the theoretical reason for this compensation is that the increase in leakage currents for the values of the injected current higher than 30 mA is related to the voltage drop due to the resistance interposed between the ground and the junction between the substrate 1 and island 6. This resistance is equal to the sum of the resistance of the substrate between the insulation walls 20 and 30, the resistance of wall 20, that of wall 30 and that of island 6. If the voltage drop due to said resistance attains a diode threshold (about 0.8 volts), the junction between substrate 1 and island 6 becomes polarized in the normal direction and injects the additional electrons into the substrate. The connection indicated above between the metallization layer 31 and the substrate allows to avoid this injection. The invention has so far been explained for the case of a monolithic integrated circuit applied to a P-type substrate. If the bipolar integrated circuit were applied to a substrate of the N-type, all that has been stated hereinbefore remains valid in reversing all the types of conductivity as well as the direction of the currents. In particular, the reference voltage of the supply source which was the most negative voltage in the previously described example, is now the most positive voltage.

Furthermore, while island 6 must surround the parasitic island completely, the metallization layers 21 and 31 can be interrupted in a portion of their perimeter to allow the passage of other connecting metallization layers directed toward the component enclosed in the island 3, which avoids having to superpose various metallization layers. Moreover, if the components positioned in certain islands 4 are particularly sensitive to leakage currents, on account, for example, of the very small magnitude of the current with which they are to be operated, it is advantageous, of course, to space these components from the parasitic island; but, according to a feature of the present invention, the insulation walls surrounding the islands containing the components are connected with the wall 30 and the island 6 by conveniently extending the metallization layer 31. The result is a still better protection of the islands. The present invention can be applied to all integrated circuits which on account of their environment, are subject to receive strong parasitic surges, especially in the automative electronics industries.

The present invention is not limited to the described embodiments. It includes many modifications and variants within the scope of the invention, as defined in the appended claims.

What is claimed is:

1. A device for protection against leakage currents in monolithic integrated circuits supplied by a supply voltage with a reference potential, having a semiconductor substrate of a first type of conductivity, coated by a layer of the second type of conductivity in which various elementary components are formed in islands insulated from each other by isolation walls of the first type of conductivity, which are connected to the substrate, with one of the said islands (parasitic island) being subject to parasitic voltages of the polarity adapted to render the junction between the parasitic island and the substrate conductive, said parasitic island being surrounded by an annular island, wherein the isolation wall of the parasitic island has a contact thereon connected to the reference supply voltage, while said annular island is electrically connected to its outer isolation wall, said contact being spaced from said annular island.

2. A device according to claim 1, wherein the substrate is of the P-type and the isolation walls are of the P+-type, the layer comprising the islands being an epitaxial layer of the N-type, and the reference potential being the most negative one of the supply source.

3. A device according to claim 1, wherein the connection between the annular island and its outer isolation wall is provided by an annular metallization layer straddling the junction between the annular island and the isolation wall.

4. A device according to claim 3, where said annular metallization layer is interrupted on a portion of its perimeter.

5. A device according to claim 3, wherein said annular metallization layer is extended to engage the isolation walls of selected islands.

6. A device according to claim 3, wherein under each metallization layer and portion of metallization layer, underlying layers are provided according to the type of conductivity of said layers to provide the desired electric resistance properties of contact.

7. A device according to claim 3, wherein the annular metallization layer is also connected to a metallization layer of the integrated circuit in ohmic contact with the lower surface of the substrate.

8. A device according to claim 1, wherein an embedded layer of the second type of conductivity and having a high doping level is provided at the interface between the base of each island and the substrate.

9. A device as in claim 1 wherein a direct metal contact is provided on said isolation wall of the parasitic island for connecting to said reference supply voltage.

* * * * *